United States Patent [19]

Crowley et al.

[11] Patent Number: 4,755,654
[45] Date of Patent: Jul. 5, 1988

[54] SEMICONDUCTOR WAFER HEATING CHAMBER

[76] Inventors: John L. Crowley, 1691 Olive Ave., Fremont, Calif. 94539; Thomas J. DeBolski, 412 - 34th Ave., Santa Cruz, Calif. 95062; Ahmad Kermani, 1293 Ayala Dr., #4, Sunnyvale, Calif. 94086; Stephan E. Lassig, 830 Terra Bella Dr., Milpitas, Calif. 95035

[21] Appl. No.: 31,073

[22] Filed: Mar. 26, 1987

[51] Int. Cl.$^4$ .............................................. H05B 3/62
[52] U.S. Cl. .................................. 219/405; 219/411; 219/390; 219/349; 118/725
[58] Field of Search ............... 219/390, 405, 411, 354, 219/388, 347, 349; 118/724, 725, 728, 50.1; 350/162.17, 162.16, 162.2

[56] References Cited

U.S. PATENT DOCUMENTS

| | | | |
|---|---|---|---|
| 1,526,925 | 2/1925 | Muckenhirn | 350/162.17 |
| 1,561,149 | 11/1925 | Gage | 350/162.16 |
| 2,134,474 | 10/1938 | Gillespie | 219/349 |
| 3,427,435 | 2/1969 | Webb | 219/411 |
| 3,544,196 | 12/1970 | Robba | 350/162.17 |
| 4,101,759 | 7/1978 | Anthony | 219/405 |
| 4,356,384 | 10/1982 | Gat | 219/347 |
| 4,550,245 | 10/1985 | Arai | 219/411 |
| 4,654,509 | 3/1987 | Robinson | 219/411 |

FOREIGN PATENT DOCUMENTS

| | | | |
|---|---|---|---|
| 59-112611 | 6/1984 | Japan | 118/724 |

OTHER PUBLICATIONS

Reinhold, Hermann D.,"Neue Bauelemente ... ", Klepzig Fachberichte, vol. 79, Apr. 1971, No. 4, pp. 207–211.

Primary Examiner—E. A. Goldberg
Assistant Examiner—Teresa J. Walberg
Attorney, Agent, or Firm—Townsend & Townsend

[57] ABSTRACT

A semiconductor wafer heating chamber has an optical element between a light source and a wafer for redistributing the light from the light source. The optical element is constructed in such a manner as to produce the desired illumination (and thus heating) pattern on the semiconductor wafer from the light source. Preferably, the light source is a long-arc lamp mounted above a base plate of a heating chamber. A primary reflector is mounted above the long-arc lamp and is shaped to produce a substantially uniform light distribution on the base plate. A quartz window is mounted between the arc lamp and the base plate. The quartz window acts as a lens to redistribute the light from the lamp and the reflector on a wafer. The window can be constructed as a diffraction grating with a series of lines formed by etching into the window or depositing material on the window to produce a diffraction pattern which gives the desired illumination pattern on the wafer. Interchangeable quartz windows are used to produce different illumination patterns which are appropriate for different size wafers and different types of heating processes.

21 Claims, 5 Drawing Sheets

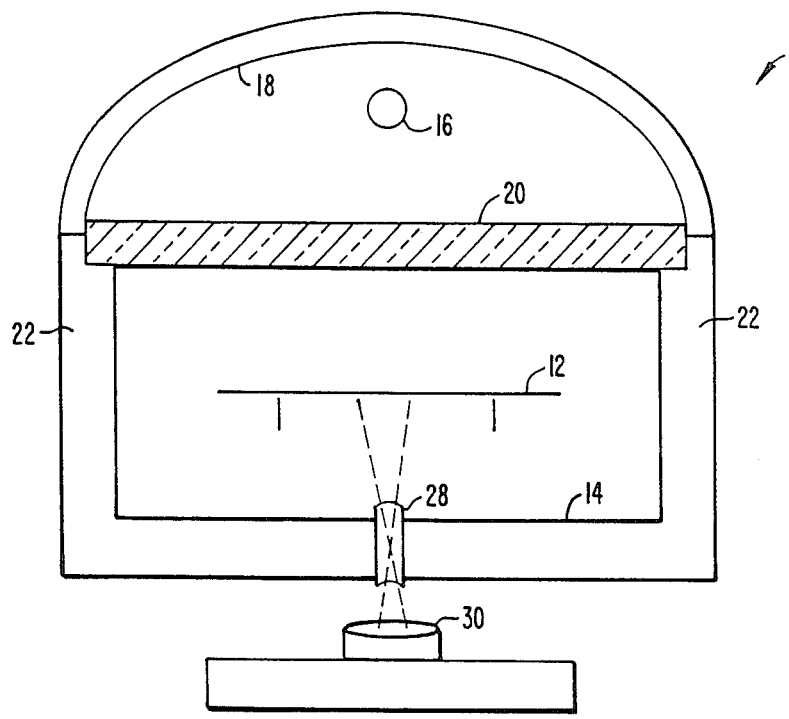
FIG._1.
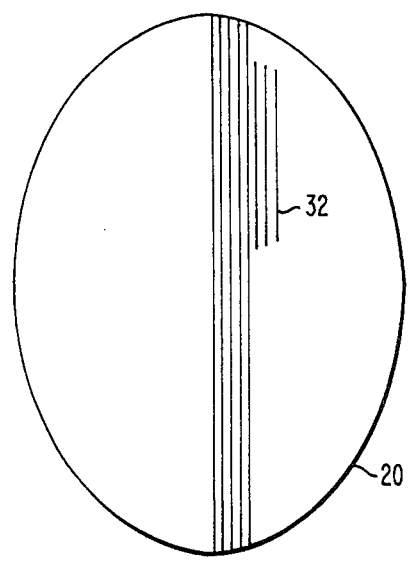
FIG._4A.
FIG._4B.
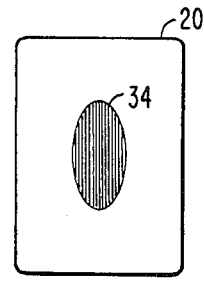
FIG._4C.

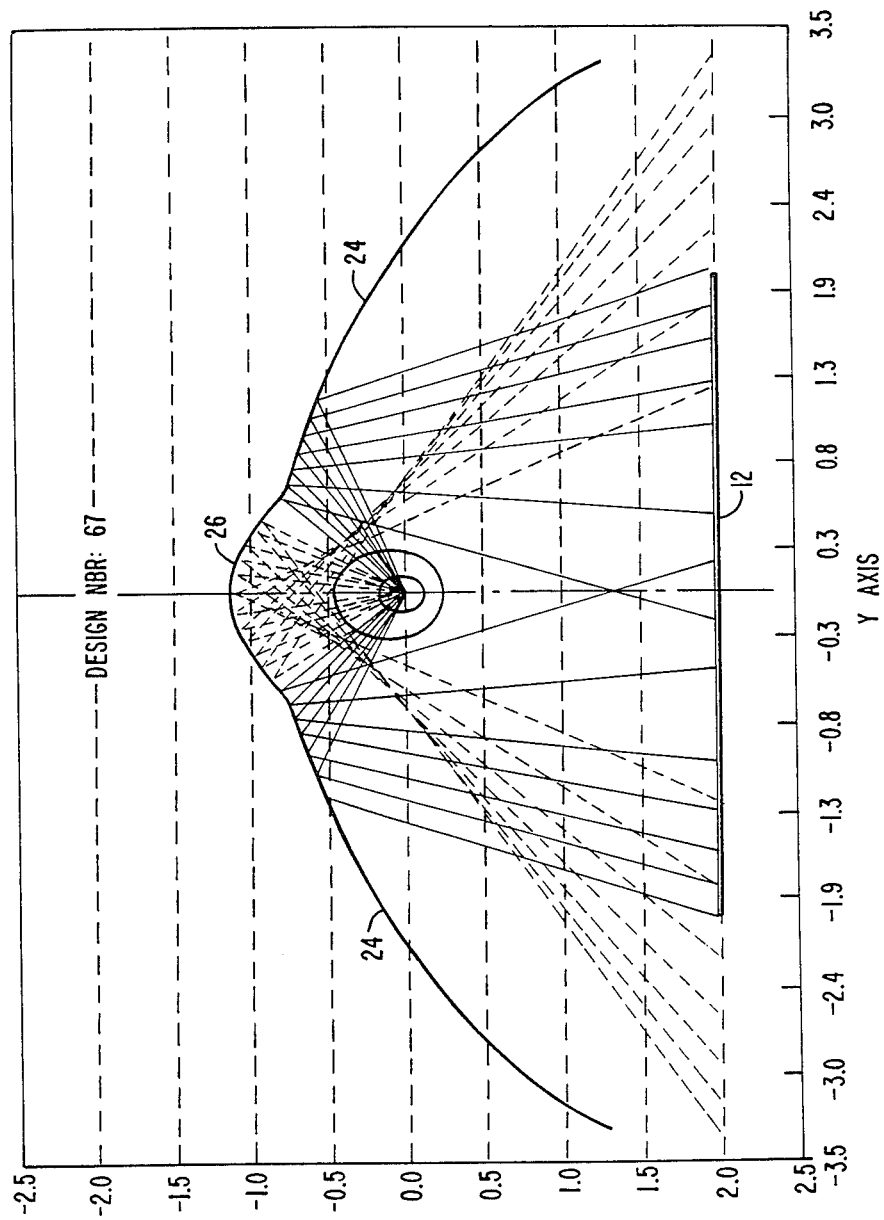
FIG._2.

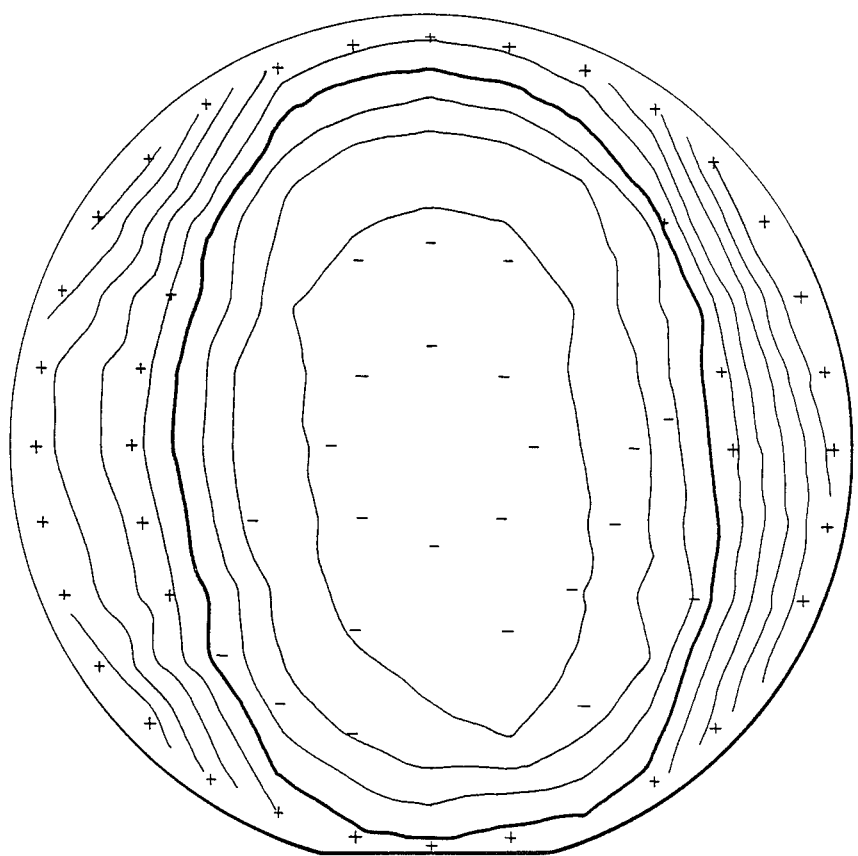
FIG._3.

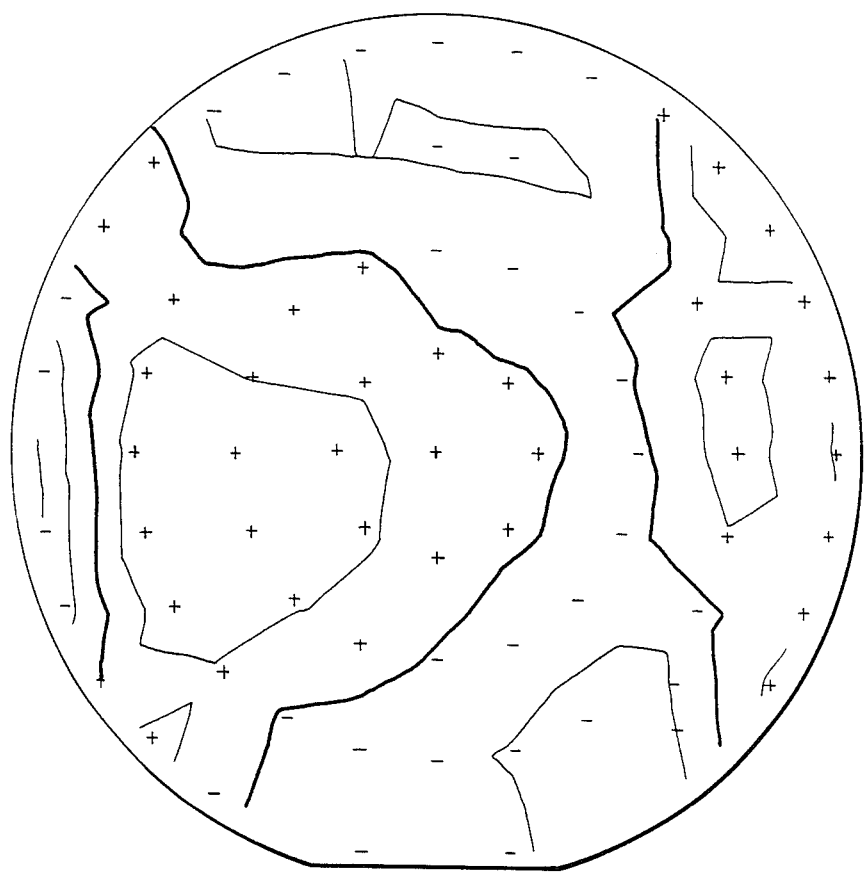
FIG._5.

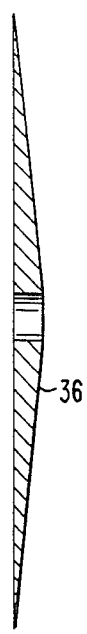
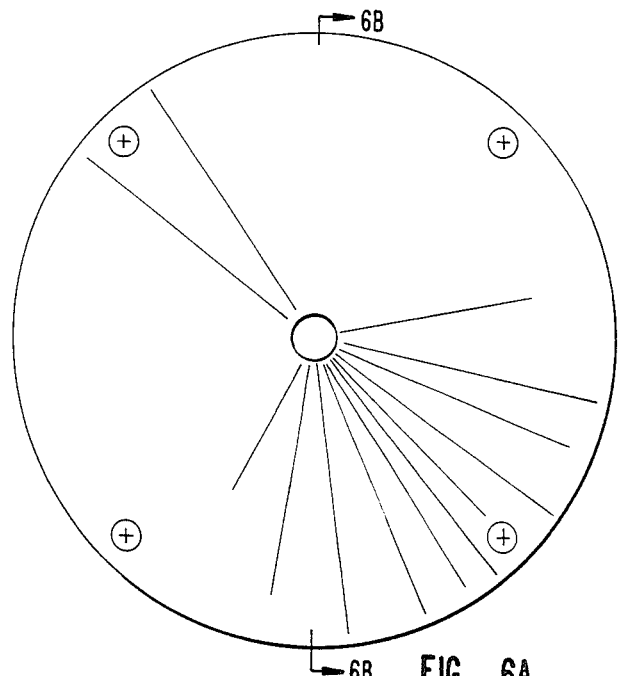
FIG._6B.   FIG._6A.
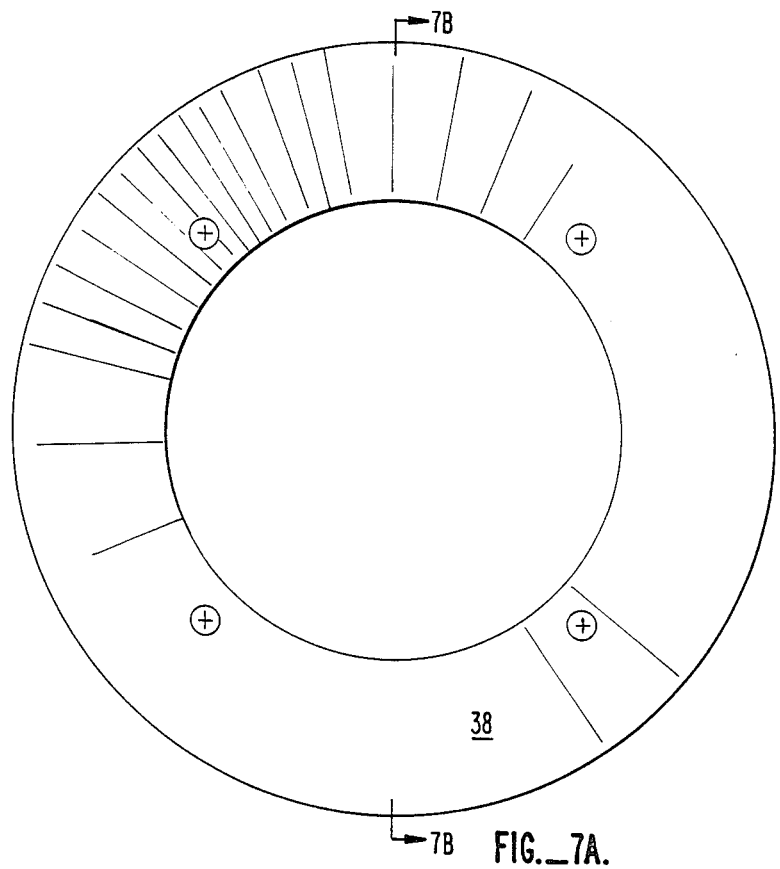
FIG._7B.   FIG._7A.

SEMICONDUCTOR WAFER HEATING CHAMBER

BACKGROUND

The present invention relates to methods and apparatus for rapidly heating semiconductor wafers.

Advances in processing of integrated circuit devices, in particular, devices of decreased dimensions, have necessitated the development of new processing and manufacturing techniques. One of the strictest requirements imposed by the tight tolerances on the dimensions of such devices has been the need to restrict the amount of time an integrated circuit device is subjected to high temperatures. This has led to the development of a rapid thermal process step, whereby the semiconductor device is irradiated with an optical source powerful enough to quickly raise the temperature of the semiconductor device to the desired process temperature and hold it at that temperature for a sufficient time to accomplish a specific process step.

In order to carry out such a rapid thermal processing step in a production environment, the heating of the semiconductor wafer must be uniform. As the speed of heating is increased, the nonuniformity of the heating is accentuated. In addition, the nonuniformity of heating may vary depending upon the size of the wafer. Finally, a heating pattern which may be desirable for one process step may be undesirable for another process step.

SUMMARY OF THE INVENTION

The present invention is an improved semiconductor wafer heating chamber having an optical element between a light source and wafer for redistributing the light from the light source. The optical element is constructed in such a manner as to produce the desired illumination (and thus heating) pattern on the semiconductor wafer from the light source.

Preferably, the light source is a long-arc lamp mounted above a base plate of a heating chamber. A primary reflector is mounted above the long-arc lamp and is shaped to produce a substantially uniform light distribution on the base plate. A quartz window is mounted between the arc lamp and the base plate. The quartz window acts as a lens to redistribute the light from the lamp and the reflector on a wafer. The window can be constructed as a diffraction grating with a series of lines formed by etching into the window or depositing material on the window to produce a diffraction pattern which gives the desired illumination pattern on the wafer. Interchangeable quartz windows are used to produce different illumination patterns which are appropriate for different size wafers and different types of heating processes.

The base plate is made of a reflective material which reflects light emitted by the wafer itself when the wafer is heated to incandescence so that it glows. By modifying the reflectivity of the base plate in different areas, the heating distribution on the wafer can be altered by the base plate as well. The reflectivity of the base plate is altered by contouring the surface of the base plate or providing a surface treatment which varies the reflectivity of the surface.

The primary reflector is structured to produce a substantially uniform lighting pattern on the wafer as a result of analyzing not only the light emitted from the lamp, but also the light reflected off of the base plate and other parts of the heating chamber and the light emitted by the wafer itself at incandescence. An optimum reflector shape was then designed, which is semi-cylindrical, with an axis parallel to the axis of the lamp, and with a wide radius of curvature except in the region immediately above the lamp which has a narrow radius of curvature to produce a bump.

The interchangeable quartz windows are made after the rest of the chamber is constructed. A semiconductor wafer is heated in the chamber, and its resistivity distribution is later measured. Because resistivity is proportional to the heating, this resistivity distribution is used to design a quartz window or base plate which will modify the light distribution to produce a desired heating pattern.

The present invention not only allows the creation of a uniform heating pattern regardless of wafer size by the use of a custom quartz window or base plate, it also allows the creation of a desired nonuniform heating distribution which is advantageous in a particular process step. For instance, higher heating at the edges of the wafer is desirable for oxidation or nitridation or other high temperature, long-time processes.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a diagram of a heating chamber according to the present invention;

FIG. 2 is a diagram showing the shape of the primary reflector according to the present invention;

FIG. 3 is a contour map showing a typical heating pattern on a semiconductor wafer without a specialized quartz window;

FIGS. 4A–4C illustrate the diffraction pattern on a quartz window according to the present invention with FIG. 4A showing a top view of the diffraction pattern, FIG. 4B showing a side view of a portion of the diffraction pattern and FIG. 4C showing a top view of the entire quartz window;

FIG. 5 is a contour map of the heating pattern on the semiconductor wafer of FIG. 3 as modified by the window of FIG. 4;

FIGS. 6A and 6B are top and side views of a base plate having a raised cone reflective surface according to the present invention; and FIGS. 7A and 7B are top and side view of a base plate having a slanted ring reflective surface according to the present invention.

DETAILED DESCRIPTION OF THE PREFERRED EMBODIMENTS

FIG. 1 is a diagram of a heating chamber 10 according to the present invention. The chamber holds a wafer 12 which is mounted in a position a short distance (0.55 inches) above a base plate 14 of the chamber. A lamp 16 provides light to wafer 12. The upward directed light from the lamp is reflected by a primary reflector 18 onto wafer 12. A quartz window 20 acts as a lens to modify the distribution of the light impinging on wafer 12. Similarly, base plate 14 has a reflective surface which reflects back the light emitted by wafer 12 when it is heated to incandescence. The walls 22 of the chamber are water-cooled stainless steel, and reflector 18 is also water-cooled. This water cooling provides a true cold-wall environment to eliminate cross-contamination when switching processes. By keeping the walls from reheating, material which may be deposited on a wall in one process is not emitted in a second process. This also prevents chamber thermal memory and its effect on the end process result.

The present invention redistributes the light emitted by lamp 16 to provide a desired heating pattern on wafer 12. There are three important components of the radiant energy emitted by lamp 16 which must be accounted for in order to achieve a photon flux which provides for the desired wafer temperature distribution: first order radiation, second order radiation and lambertion radiation. The first order radiation is the light directly emitted from the lamp or after reflection from a surface such as reflector 18 or walls 22 of the chamber. The second order radiation is primary radiation which is reflected off the wafer and then back onto the wafer after being reflected off of reflector 18 or walls 22. The lambertion radiation is light which is emitted by the wafer as the wafer heats up to incandescence and becomes a second source of optical radiation, which is then reflected off reflector 18 or the other chamber surfaces and back onto the wafer to be reabsorbed.

By tracing the paths of the light rays from these three sources, and modifying the shape of reflector 18 until a uniform distribution is obtained on wafer 12, the reflector shape shown in FIG. 2 is achieved. The reflector has portions 24 with a wide radius of curvature and a portion 26 with a narrow radius of curvature. The arc lamp itself is located at position 0,0 above wafer 12.

Window 28 in the bottom of chamber 10 of FIG. 1, allows an optical pyrometer 30 to measure the heating at the center of wafer 12. This heating value provides a feedback to the control system (not shown) for the chamber to maintain the desired heating value.

The heating distribution on a wafer can be measured by heating the wafer, then removing the wafer from the chamber and measuring the resistivity pattern using a mapping four-point probe. The resistivity of any portion of the wafer is proportional to the heating which that portion of the wafer was subjected to. Such a measurement taken with a clear window 20 produced the resistivity contour map of FIG. 3. The contour map of FIG. 3 used a 4", P type (100) silicon wafer implanted with arsenic at an energy of 80 keV to a dose of $1 \times 10^{16}$ atoms/cm$^2$ and subjected to a rapid thermal anneal of 1100° C. for 11 seconds. As can be seen, the resistivity varies with a standard deviation of over 6%. This pattern will be different depending upon the size of the wafer. Accordingly, a series of quartz windows 20 can be produced, with each being optimized for a particular wafer size.

Using the contour map of FIG. 3, a pattern for quartz window 20 is designed to produce a uniform implant anneal on a 4" wafer. FIG. 4A shows a central portion of window 20 which has a series of lines 32 scribed into the quartz. These lines are shown in cross-section in FIG. 4B as diagonal shaped grooves. The pattern of these lines is varied as necessary to produce the desired uniform heating pattern. FIG. 4C shows an entire quartz window 20 which has only a central portion 34 scribed with the lines, the remaining portion of the window being clear. This pattern will reduce the heating of the central part of the wafer by shading and by scattering the light through diffraction.

Using quartz window 20 of FIG. 4C in chamber 10 for the same process used to produce the contour map of FIG. 3, the contour map of FIG. 5 is produced. As can be seen, the resistivity, and thus the heating distribution, is more even, with a standard deviation of a little over 2%.

The length, depth, width and spacing of the lines of FIGS. 4A–C can be varied to produce the desired pattern. The lines control the amount of light which is shaded and/or redirected. Alternately, the lens can be produced by grinding, sawing, or laser scribing. The lines could also be produced by depositing a semitransparent or opaque metal pattern on the surface of the window.

Other processes than ion implant anneal may require a different redistribution of the light. For example, high temperature, long-time processes such as oxidation or nitridation tend to induce crystallographic defects in the wafer, such as dislocations and slip. To prevent this from happening, the edges of the wafer should be hotter than the center. The lens pattern on the window is easily adjusted to accomplish this, creating another optical element specifically designed for that process and a particular size of wafer.

Chamber base plate 14 is important in the reflection and distribution of the lambertion radiation emitted by the wafer at higher temperatures. Nonuniformities in the infrared reflectivity of this optical element will cause temperature nonuniformities in the heating of the wafer. In one embodiment, the base plate is simply a flat plate with a uniform specular surface. Alternatively, the reflectivity of the base plate can be shaped so that, used alone or in combination with window lens 20, the desired temperature profile on the wafer can be obtained. The reflectivity of the base plate can be shaped in a variety of ways. One way is to contour the surface of the base plate. FIGS. 6A and 6B show top and side views of a base plate reflector where the center of the reflector is cone shaped. The reflective surface 36 is slanted downward away from the center to direct lambertion radiation away from the center of the wafer and thus make the center cooler than the edges of the wafer.

FIGS. 7A and 7B show top and side views of another embodiment of a base plate which has a raised ring 38 located beneath the outer perimeter of the wafer. Ring 38 is sloped towards the center of the wafer. The effect of this shape is to direct lambertion radiation that would normally miss the wafer back toward the edges of the wafer and thus make the edges hotter than the center. This would be useful for high temperature, long-time processes such as oxidation or nitridation.

Instead of shaping the contour of base plate reflector 14, it is also possible to vary the reflectivity of a flat base plate by altering the surface of the metal. Different surface treatments of the base plate can affect the reflectivity at the desired wavelengths by +/−20% with ease. These surface treatments are applied in a pattern to provide the desired temperature profile. The surface treatment can include scouring portions of the plate to limit the reflectivity of such portions.

As will be understood by those familiar with the art, the present invention may be embodied in other specific forms without departing from the spirit or essential characteristics thereof. For example, the quartz window or base plate could have a series of patterns inscribed thereon with the window or plate being larger than the chamber. The window or plate could then be rotated or otherwise moved to put the appropriate portion in the chamber. This could be done by monitoring feedback from an optical pyrometer and choosing a portion of each element which would produce a selected pattern. Alternately, the lamp and primary reflector could be mounted below the wafer, or in other configurations. A number of lamps could be used rather than one lamp, or other modifications of the chamber could be made. Accordingly, the disclosure of the preferred embodiments of the invention is intended to be illustrative, but not limiting, of the scope of the invention which is set forth in the following claims.

What is claimed is:

1. A heating chamber for a semiconductor wafer comprising:
    a base for holding said semiconductor wafer;
    a light source for irradiating said wafer; and
    optical means, mounted between said light source and said semiconductor wafer, for modifying a distribution of light to produce a non-uniform distribution of light on said wafer.

2. The apparatus of claim 1 further comprising a plurality of said optical means, each optical means being customized for a different wafer or heating process.

3. The apparatus of claim 1 wherein said optical means comprises a lens mounted between said light source and said wafer.

4. The apparatus of claim 1 wherein said optical means comprises a quartz window having a plurality of spaced lines.

5. The apparatus of claim 1 further comprising a reflective plate mounted between said base and said wafer for non-uniformly reflecting light.

6. The apparatus of claim 5 wherein a central positon of said reflective plate is cone shaped with a sloped surface extending downward away from said central position of said reflective plate.

7. The apparatus of claim 5 wherein said reflective plate includes a raised ring with a sloped surface extending downward toward a center of said ring.

8. The apparatus of claim 1 further comprising a reflector mounted on an opposite side of said light source from said wafer.

9. The apparatus of claim 1 wherein said light source comprises a long arc lamp.

10. A heating chamber for a semiconductor wafer comprisng:
    a base for holding said wafer;
    a single long-arc lamp non-movably mounted above said base;
    a reflector mounted above said long-arc lamp; and
    a plurality of interchangeable windows adapted to be removably mounted between said long-arc lamp and said wafer, each window being customized to redistribute light from said lamp to form a different non-uniform pattern of light on said wafer.

11. The apparatus of claim 10 wherein said reflector is semi-cylindrical and has an axis parallel to an axis of said lamp, said reflector having a radius of curvature less than a distance from said reflector to said lamp in a region extending approximately 30° on either side of a vertical line through said lamp, a majority of a remaining portion of said reflector having a radius of curvature of approximately twice the distance from said reflector to the center of said wafer.

12. A heating chamber for a semiconductor wafer comprising:
    a base for holding said wafer;
    a long-arc lamp mounted above said base;
    a reflector mounted above said long-arc lamp;
    a plurality of interchangeable windows adapted to be removably mounted between said long-arc lamp and wafer, each window being customized to redistribute light from said lamp to form a different pattern of light on said wafer; and
    a plurality of base plates adapted to be removably mounted between said base and said wafer, each said base plate being customized to reflect light emitted from said wafer in a different pattern.

13. A method for heating a semiconductor wafer in a heating chamber having a base for holding said wafer, a lamp mounted above said base and a reflector mounted above said lamp, comprising the steps of:
    determining a desired heating pattern of said wafer;
    heating a sample wafer similar to said wafer in said chamber;
    measuring a resistivity pattern of said sample wafer;
    determining a non-uniform redistribution of light from said lamp for substantially changing said actual heat distribution to said desired heating pattern;
    forming an optical window to produce said non-uniform redistribution when placed between said lamp and said wafer; and
    mounting said optical window between said lamp and said wafer.

14. The method of claim 13 wherein said step of forming an optical window includes the step of producing a series of lines on a quartz window.

15. The method of claim 13 further comprising the steps of:
    forming a reflective base plete for non-uniformly reflecting light to modify said actual heat distribution of said wafer; and
    mounting said base plate between said base and said wafer.

16. A method for heating a semiconductor wafer in a heating chamber having a base plate for supporting said wafer, a lamp mounted above said base plate and a reflector mounted above said lamp comprising the steps of:
    mounting an optical element for non-uniformly redistributing light from said lamp between said lamp and said base plate;
    placing said semiconductor wafer on said base plate; and
    turning on said lamp.

17. The method of claim 16 further comprising the steps of:
    replacing said first optical element with a second optical element for non-uniformly redistributing light from said lamp in a different manner;
    replacing said first-mentioned semiconductor wafer with a second semiconductor wafer; and
    turning on said lamp.

18. A heating chamber for a semiconductor wafer comprising:
    a base for holding said semiconductor wafer;
    a single long-arc lamp non-movably mounted above said base;
    a quartz window having a plurality of spaced lines mounted between said long-arc lamp and said semiconductor wafer, said lines being arranged to modify a distribution of light from said long-arc lamp to produce a non-uniform pattern of light on said semiconductor wafer.

19. The heating chamber of claim 18 wherein said lines are arranged to direct more light to a portion of said semiconductor wafer proximate an outer perimeter of said wafer than to a central portion of said wafer.

20. A heating chamber for a semiconductor wafer comprising:
a base for holding said semiconductor wafer;
a light source for irradiating said wafer; and
a reflective plate mounted between said base and said wafer for non-uniformly reflecting light, a central position of said reflective plate being cone shaped with a sloped surface extending downward away from said central position of said reflective plate.

21. A heating chamber for a semiconductor wafer comprising:
a base for holding said semiconductor wafer;
a light source for irradiating said wafer; and
a reflective plate mounted between said base and said wafer for non-uniformly reflecting light, said reflective plate including a raised ring with a sloped surface extending downward toward a center of said ring.

* * * * *